United States Patent [19]
Aoki et al.

[11] Patent Number: 5,406,077
[45] Date of Patent: Apr. 11, 1995

[54] ABSOLUTE VALUE ENCODER AND AN OUTPUT CORRECTION METHOD OF ABSOLUTE VALUE ENCODER HAVING A SIGNAL PROCESSING/CONTROL CIRCUIT

[75] Inventors: Yukio Aoki; Takao Mizutani; Tsutomu Kazama; Mitsuyasu Kachi; Tadakatsu Yokoi; Hirokazu Sakuma, all of Aichi, Japan

[73] Assignee: Mitsubishi Denki kabushiki Kaisha, Tokyo, Japan

[21] Appl. No.: 219,467

[22] Filed: Mar. 29, 1994

[30] Foreign Application Priority Data
Mar. 30, 1993 [JP] Japan .................................. 5-072094

[51] Int. Cl.⁶ ............................................ G01D 5/34
[52] U.S. Cl. ................................ 250/231.18; 250/205
[58] Field of Search ..................... 250/231.18, 231.16, 250/231.14, 231.1, 205; 340/870.15, 870.2, 870.22

[56] References Cited

U.S. PATENT DOCUMENTS 5,073,711  12/1991  Brininstool et al. ............ 250/231.18
5,241,172   8/1993  Lugaresi ......................... 250/231.16

FOREIGN PATENT DOCUMENTS 62-12815  1/1987  Japan .............................. G01D 5/36
331720    2/1991  Japan .............................. G01D 5/36
486522    3/1992  Japan .............................. G01D 5/36
4213021   8/1992  Japan .............................. G01D 5/36

Primary Examiner—David C. Nelms
Assistant Examiner—Que T. Le
Attorney, Agent, or Firm—Sughrue, Mion, Zinn, Macpeak & Seas

[57] ABSTRACT

The position of a machine tool or the like is accurately obtained by an absolute value encoder. Light emission elements emit light which passes through scales containing optical patterns and is detected by light receiving elements. First, a signal detected by the light receiving elements while the light emission elements are extinguished is stored in memory. Then, the light emission elements are lighted and the signal detected by the light receiving elements is corrected by the previously stored signal.

7 Claims, 8 Drawing Sheets

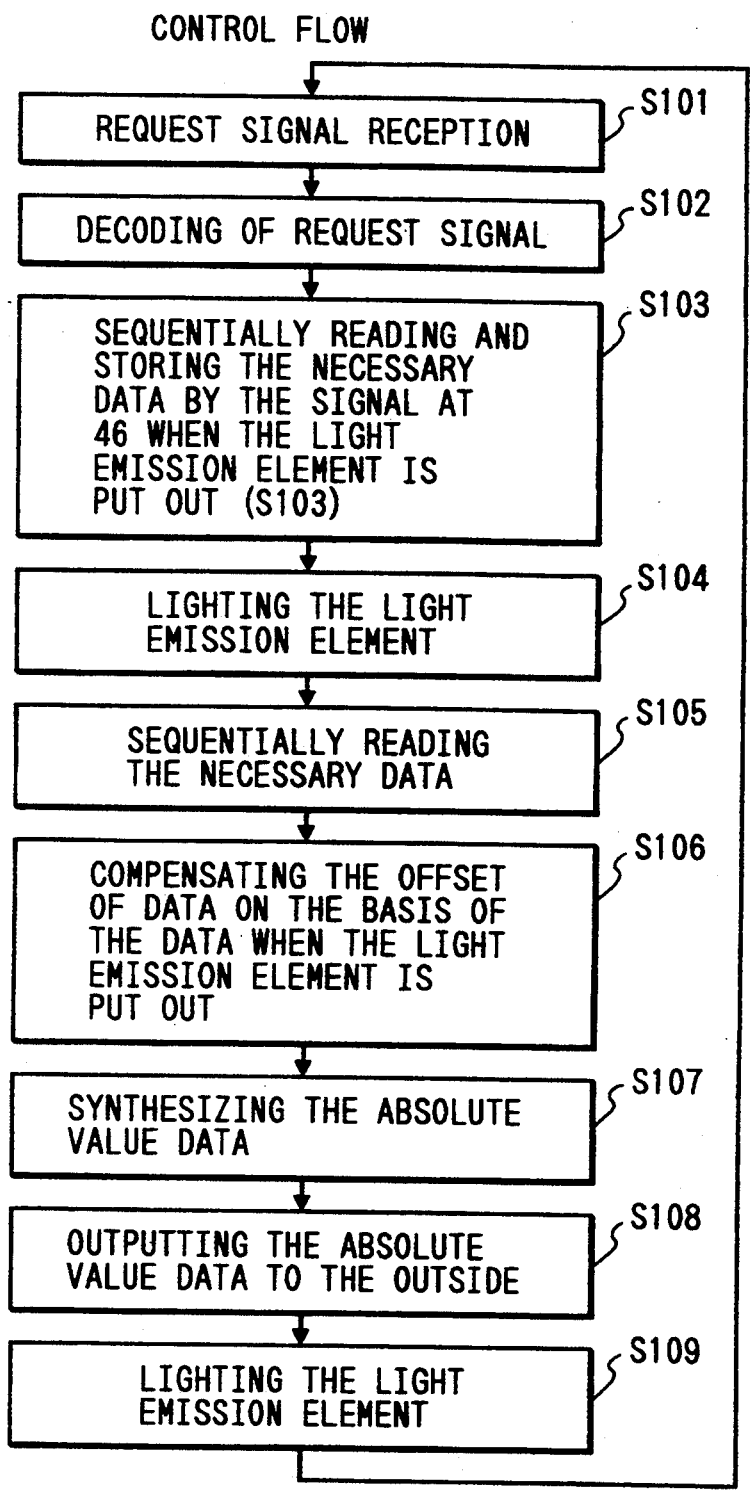

5,406,077

ABSOLUTE VALUE ENCODER AND AN OUTPUT CORRECTION METHOD OF ABSOLUTE VALUE ENCODER HAVING A SIGNAL PROCESSING/CONTROL CIRCUIT

BACKGROUND OF THE INVENTION

FIELD OF THE INVENTION

The present invention relates to an absolute value encoder for detecting the absolute position of a machine-tool and the like with a high level of accuracy and reliability and also to an output correction method for an absolute value encoder.

BACKGROUND OF THE INVENTION

FIG. 8 is a block diagram showing an absolute value encoder disclosed in Japanese Unexamined Patent Publication (Kokai) No. 4-213021. In the figure, 1 is a rotatable main scale where an absolute code pattern 1a and an incremental pattern 1b are installed in parallel with each other. 2 is a light emission element common to the absolute code pattern 1a and the incremental pattern 1b, 3 is a non-spherical collimator lens for forming the light from the light emission element 2 into a parallel beam, 4a is a light receiving element for detecting the absolute code pattern, 4b is a light receiving element for detecting the incremental pattern, 5 is an index scale for the incremental pattern including a pattern 5a, and 6 is a non-spherical collimator lens for converging the light passed through the incremental pattern 1b.

Further, 7 is a current control circuit, which causes the light emission element 2 to be brightly illuminated for only a stipulated time necessary for reading the absolute code pattern 1a when an optional request signal is input, then makes the minimum emission necessary for detecting the incremental pattern 1b. 8 is a signal processing circuit which contains a processing circuit 8a for processing the signal received by the light receiving element 4a and a processing circuit 8b for processing the signal received by the light receiving element 4b. Further, 9 is a control circuit which activates, as described later, a memory 10 inside the control circuit 9 and a power source 11 outside the control circuit 9.

The conventional first absolute value encoder constructed as described above can obtain the absolute value information from the absolute code pattern 1a and the light receiving element 4a and can also obtain the pulse signal involved in the rotation of main scale 1 from the incremental pattern 1b and the light receiving element 4b. Therefore, after the light emission element 2 is brightly illuminated and the initial value of absolute position has been read out from the absolute code pattern 1a when a request signal is input, the pulse signal detected by the light receiving element 4b is integrated for continuously obtaining and updating the absolute position.

FIG. 9 is a diagram of the absolute value encoder, where the time axis is the abscissa, to show actuation in time series. Namely, when an external request signal from a controller such as a servo amplifier or a numerical control unit is received, the signal is input to the current control circuit 7 from the control circuit 9, and a relatively high current flows to the light emission element 2 for intensive light emission. At this time, the output of light receiving element 4a is input to the control circuit 9 as an absolute value signal through the signal processing circuit 8a.

After storing the absolute value signal into a memory 10, the control circuit 9 reads the incremental pattern 1b via the light receiving element 4b and the signal processing circuit 8b not only for starting to count the incremental signal but also for emitting an end signal to the current control circuit 7 which then causes a relatively low current to flow to the light emission element 2, which then begins to maintain a lower level of luminosity sufficient for reading the incremental pattern 1b.

Moreover, the control circuit 9 acts as an incremental encoder which converts the absolute value signal into a pulse signal taking into account the travel distance after recording the absolute value signal into the memory. Then, the incremental signal is output.

Therefore, a reception side unit to be connected to the output terminal, after counting the first pulse signal using an up-down counter and setting the initial value, performs the usual incremental actuation. That is to say, the absolute values at every moment are obtained by setting the up-down counter according to the turning direction of the main scale and by performing a pulse count.

Further, at a later time, if another request signal is input, the actuation is repeated so that an updated absolute position can be obtained by a repetition of the above-described operation.

An example of a second absolute value encoder having a plurality of light emission elements will now be explained using FIG. 10 and FIG. 11. Numeral 20 in these figures is a light receiving element, and a light receiving element pattern portion 20a and a light receiving element pattern portion 20b installed on the light receiving element 20 correspond respectively to light emission element 21 and light emission element 22. In addition, 23 and 24 are light shielding cylindrical caps mounted respectively on the light emission elements 21 and 22. For reference, the other elements are identical to those in FIG. 8, and thus their descriptions are not repeated. Identical elements are given the same reference numerals.

Light beams output parallel to the longitudinal axis of caps 23 and 24 from each of light emission elements 21 and 22 pass, as is, through an index scale 5 and a main scale 1 and reach the corresponding light receiving element patterns 20a and 20b. On the other hand, light beams not emitted in parallel to the longitudinal axis of caps 23 and 24 collide with and are reflected by the caps, part of the light entering obliquely into the corresponding light receiving element pattern, part entering obliquely into the other light receiving element pattern and part being diffused to the outside. The signals obtained via the respective light receiving element patterns 20a and 20b of light receiving element 20 correspond to upper and lower ordered bits, respectively, of absolute value signals and are output as the absolute value signals through the signal processing circuit 8 and the control circuit 9.

If the light shielding caps 23 and 24 are not used in this encoder, the light from the light emission element 21 will impinge upon the light receiving element pattern 20b or the light from the light emission element 22 will impinge upon the light receiving element pattern 20a in some cases.

Further, even during the off time of a light emission element, light may still be generated. That is, initially the light emission element may not emit light due to a change in temperature. However, as time goes on, the light emission element slowly deteriorates and a current may flow through the light emission element when the temperature changes causing a light output to be apparently detected, thus resulting sometimes in a loss of detection accuracy.

Therefore, offset compensation has been considered for the purpose of enhancing the detection accuracy. An offset compensation method for performing light emission element lighting control lights each light emission element cyclically. This method is disclosed in detail, for example, in Japanese Unexamined Patent Publication (Kokai) No. 3-31720.

Because the conventional absolute value encoder is structured as described above, the request signal can be processed only when the encoder is stopped, and if another request signal is input during the rotation of the encoder it becomes impossible to determine the absolute position and movement (rotation) speed while processing a previous request signal.

Further, because there is a single light emission element in the first absolute value encoder described above, not only is a non-spherical collimator lens necessary, but also accurate absolute position can not be detected once the light emission element is turned off, and the luminosity of the light emission element must be controlled which requires a complex current control circuit.

On the other hand, because a plurality of light emission elements are used in the second absolute value encoder described above, a great deal of power is required and a larger power source is required. In addition, correct absolute value data can not be obtained due to the influence of reflected light from the light shielding cap. Moreover, a great deal of current is consumed because the light emission element is lighted cyclicly in the offset compensation for this encoder.

SUMMARY OF THE INVENTION

An object of the present invention, which has been conceived for the purpose of solving the problems described above, is to obtain an absolute value encoder for providing power savings, a more compact power source capacity and an enhancement in accuracy. Further, it is an object of the invention to provide an output correction method for an absolute value encoder.

The position of a machine tool or the like is accurately obtained by an absolute value encoder. Light emission elements emit light which passes through scales containing optical patterns and is detected by light receiving elements. First, a signal detected by the light receiving elements while the light emission elements are off is stored in memory. Then, the light emission elements are lit and the signal detected by the light receiving elements is corrected using the previously stored signal.

BRIEF DESCRIPTION OF THE DRAWINGS

FIG. 4 is a flow diagram showing the control routine of a control circuit in the first embodiment according to the present invention.

DESCRIPTION OF THE PREFERRED EMBODIMENTS

Figure 1:
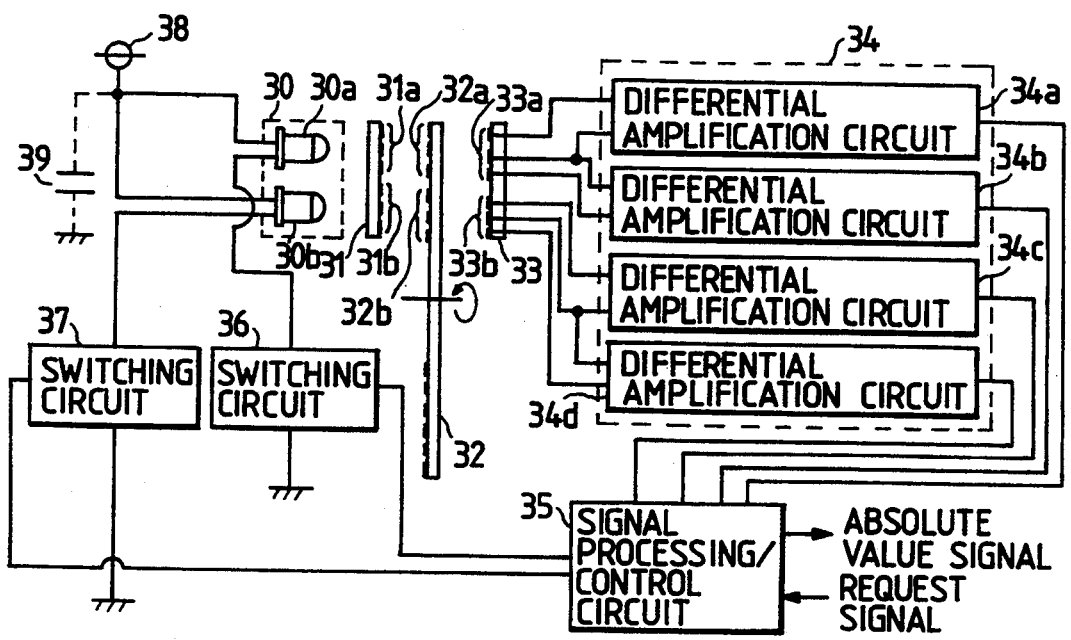
FIG. 1 is a block diagram showing an absolute value encoder in a first preferred embodiment of this invention.
Figure 2:
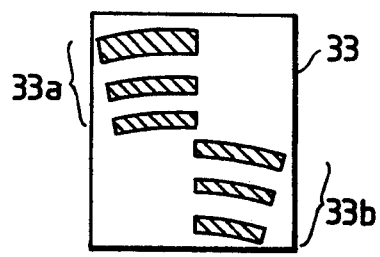
FIG. 2 is a view showing a light emission element in the first preferred embodiment of this invention.

A preferred embodiment of this invention will be explained below. 30 in FIG. 1 is a light emission circuit having light emission elements 30a and 30b, 31 is an index scale consisting of an area where light can permeate and another area where light cannot permeate, and is composed of a pattern portion 31a corresponding to the light emission element 30a and a pattern portion 31b corresponding to the light emission element 30b. 32 represents a main scale having a plurality of patterns (either a fan type pattern or a sinusoidal wave form analog pattern are acceptable) where the light permeable and impermeable areas are repeated at a certain cycle on the circumference, and is structured as a disc shape rotary panel. 32a is a group of patterns representing an upper ranking (higher ordered) bit when converted into an absolute value code, whereas 32b is a group of patterns representing a lower ranking (lower ordered) bit when converted into an absolute value code. 33 is a light receiving element which is constituted by a group of patterns 33a corresponding to the light emission element 30a and a group of patterns 33b corresponding to the light emission element 30b. For reference, FIG. 2 is a detailed view of light receiving element 33.

34 represents a differential amplification system which consists of differential amplification circuits 34a, 34b, 34c and 34d. 35 is a signal processing control circuit composed, for example, of a single-chip microcomputer. 36 and 37 denote switching circuits, and 38 is a power source supplied from the outside. For reference, the signals that can be obtained from the index scale 31, the main scale 32 and the light receiving element 33 are analog values (signals that can be electrically interpolated, for example, signals that can be changed into a sinusoidal wave state together with the position of the encoder).

Figure 3:
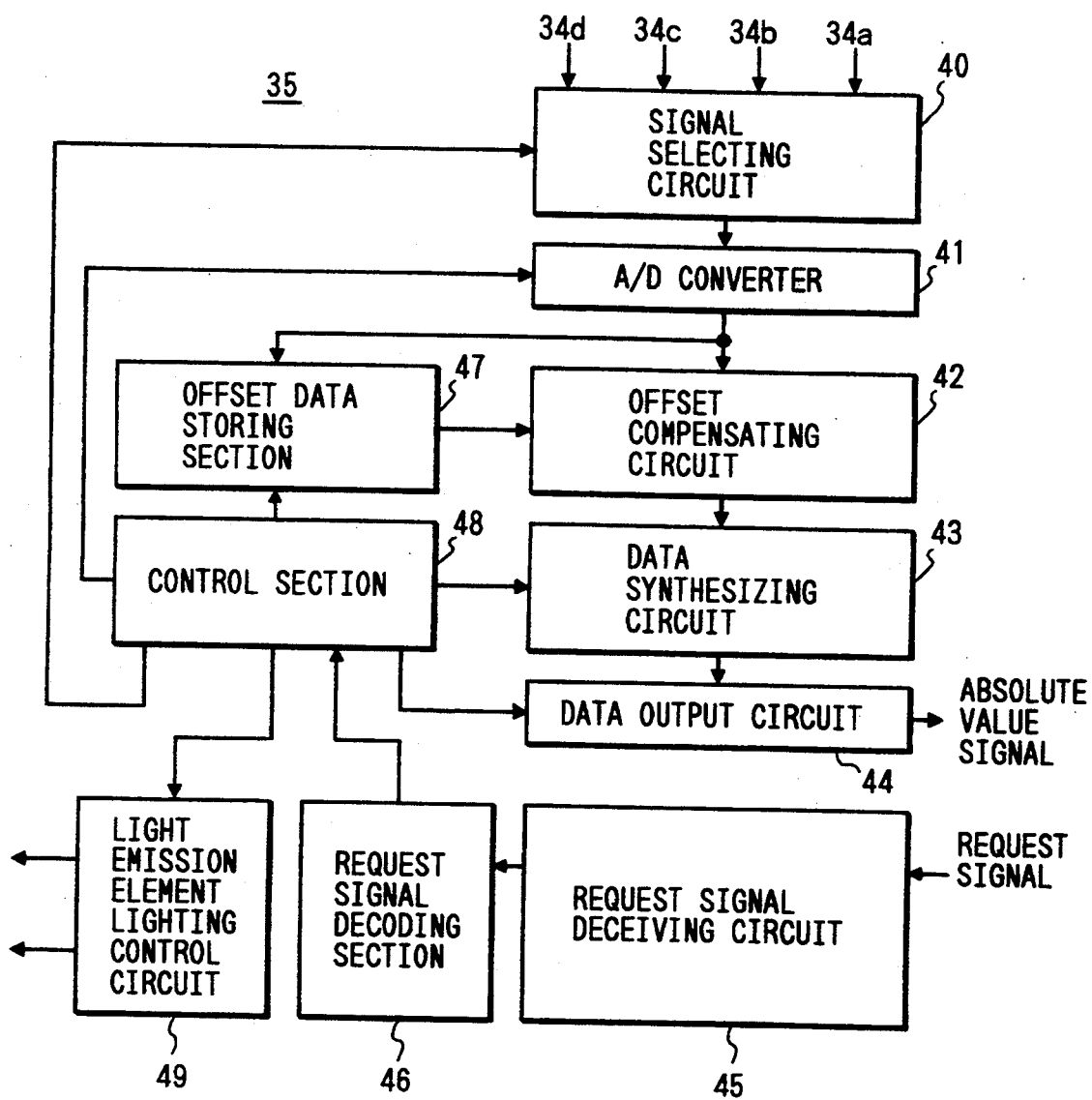
FIG. 3 is a view showing the details of a signal processing/control circuit in the first preferred embodiment of the present invention.

The signal processing/control circuit 35 will be explained by way of FIG. 3. In FIG. 3, 40 is a signal selecting circuit, 41 an A/D converter, 42 an offset compensating circuit, 43 a data synthesizing circuit, 44 a data output circuit, 45 a request signal receiving circuit, 46 a request signal decoding section, 47 an offset data storing section, 48 a control section and 49 a light emission element lighting control circuit.

When a request signal in accordance with a predetermined format is input to the signal processing/control circuit 35 from outside devices (a servo amplifier, numeral control unit, etc.), the circuit 35 operates in accordance with the control flow shown in FIG. 4.

The request signal received (S101) by the request signal receiving circuit 45 is decoded (S102) by the request signal decoding section 46, and the decoded result is transmitted to the control section 48. The control section 48 then instructs the light emission elements to be turned off (extinguished) via circuit 49 and switches 36 and 37. The control section 48 then provides control signals to select the necessary signals from differential amplification circuits 34a-34d sequentially at the signal selecting circuit 40 in accordance with the contents of the request signal. The A/D converter 41 converts the selected signals into digital form and the digitalized signals are stored into the offset data storing section 47 (S103).

The control section 48 sends control signals to the light emission element lighting control circuit 49 to control the switching circuits 36 and 37, and directs current to the light emission elements 30a and 30b from the power source 38 to light the necessary light emission elements (any of elements 30a and 30b, or both, depending on the contents of the request signal)(S104). The light projected from the light emission elements 30a and 30b is transmitted into the light receiving elements 33a and 33b through the index scale 31 and the main scale 32. The light entered into the light receiving elements 33a and 33b is converted into an electric current and input into the signal selecting circuit 40 (S105) through the differential amplification circuit 34.

As previously noted, the signal(s) corresponding to the command from the control section 48 is selected by the signal selecting circuit 40, digitalized by the A/D converter 41 and input into the offset compensating circuit 42. The offset data of the signal(s) is input into the offset compensating circuit 42 (S106) from the offset data storing section 47 under command of control section 48. The offset compensating circuit 42 outputs to the data synthesizing circuit 43 (S106) the data which results from a combination of data from offset data storing section 47 and A/D converter 41. That is, the data from A/D converter 41 is corrected by the offset data stored in the offset data storing section 47.

Figure 5A:
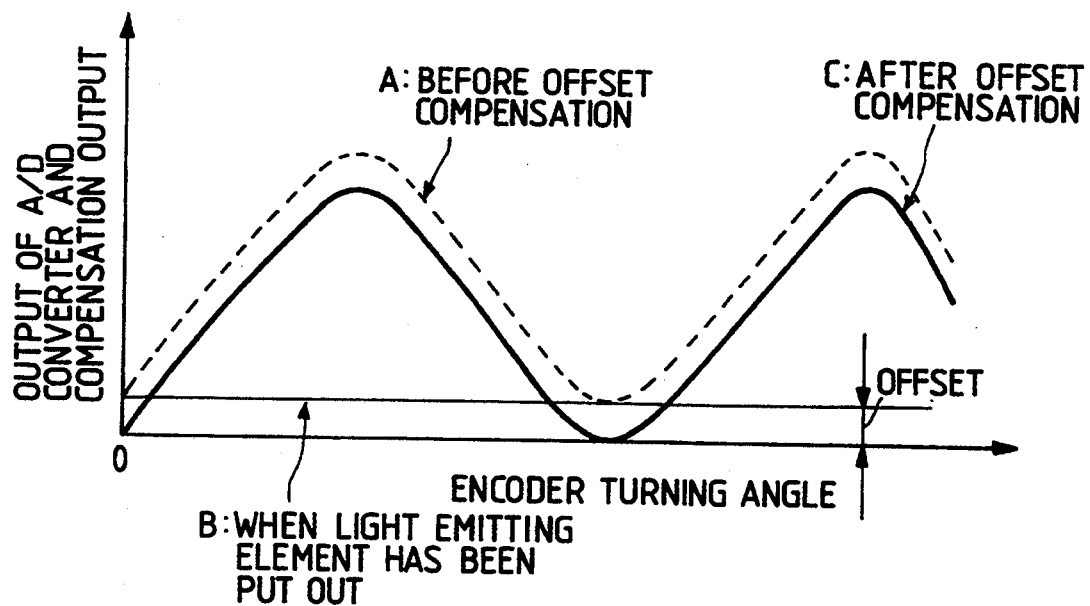
FIGS. 5(a) and 5(b) explain an offset compensating method in the first embodiment according to this invention.
Figure 5B:
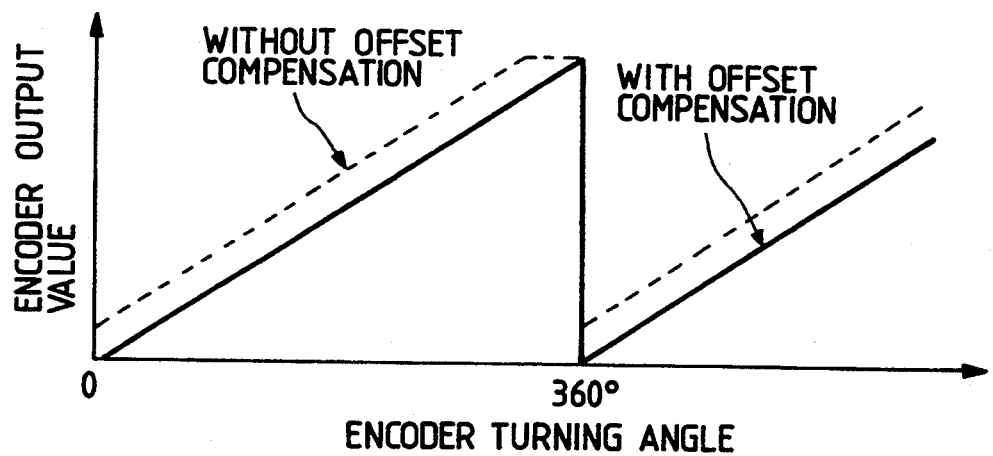

FIGS. 5(a) and 5(b) show the data synthesizing operation in the offset compensating circuit 42. In FIG. 5(a), the wave form given by the dotted line A is the output waveform from the A/D converter 41. The offset output from the light receiving elements 33a and 33b when the light emission elements 30d and 30b are turned off is given by the solid line B of FIG. 5(a). The values of lines A and B are subtracted, one from the other, by the offset compensating circuit 42, and the output is shown by the solid line C and is sent out from the offset compensating circuit 42. FIG. 5(b) shows the relation between the encoder output value without the offset correction of FIG. 5(a) and the encoder output value with the offset correction on the basis of the encoder turning angle. In FIG. 5(b), the dotted line is the encoder output value without the offset correction while the solid line is the encoder output value with the offset correction.

The data synthesizing circuit 43 synthesizes the data of another signal obtained similarly by changing over the signal selecting circuit 40 under command of the control section 48, and transmits the data to the data output circuit 44 (S107). The data output circuit 44 outputs this data as an absolute value signal to the outside source (a servo amplifier, numeral control unit, etc.).

When all the necessary absolute value signals have been selected by the signal selecting circuit 40, the control section 48 sends a command to extinguish all of the light emission elements 30a and 30b to the light emission element lighting control circuit 49 which then extinguishes light emission elements 30a and 30b via the switching circuits 36 and 37.

For example, if only the upper ranking bit of absolute value data is demanded by the request signal, the signal processing/control circuit 35 lights only the light emission element 30a, synthesizes the upper ranking bit of absolute value data and outputs it via the signals produced by the group of index scale patterns 31a, the group of main scale patterns 32, the group of light receiving element patterns 33a and the differential amplification circuit 34a.

Figure 6:
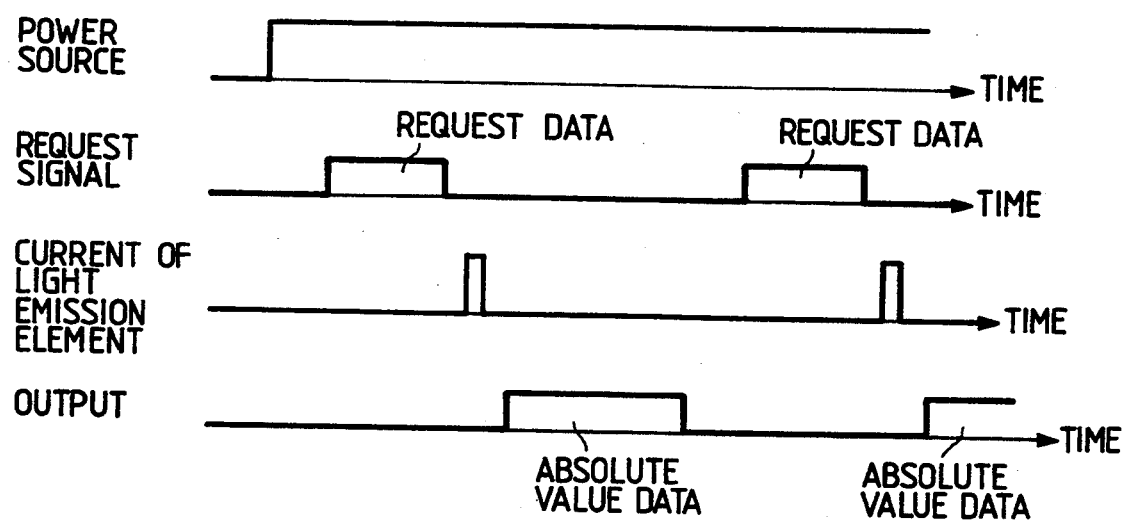
FIG. 6 is a diagram of an absolute value encoder according to the first preferred embodiment of this invention.

FIG. 6 is a diagram of the absolute value encoder, where the time axis is plotted on the abscissa to show its actuation in time series. Namely, only when the request signal is input with the power source 38 switched on, the current flows temporarily to the light emission element to light it up, and the absolute value signal is read and output.

The first embodiment uses two light emission elements, but a similar effect can be obtained even if three or more light emission elements are used.

Further, though the first embodiment uses plural numbers of main scale patterns, index scale patterns and light receiving element patterns corresponding to the respective light emission elements, the resolution may be enlarged by electrically interpolating single ones of these patterns.

Next, a second embodiment of this invention will be described. Its structure is similar to the first embodiment, but the control actuation of signal processing/control circuit 35 differs in this embodiment from the first embodiment, so its actuation flowchart will be explained with reference to FIG. 7. When the request signal in accordance with the predetermined format is input to the signal processing/control circuit 35 from the outside source (servo amplifier, NC unit, etc.), the signal processing/control circuit 35 operates according to the control flow shown in FIG. 7. Namely, the request signal received by the request signal receiving circuit 45 (S201) is decoded (S202) at the request signal decoding section 46, and the decoded result is sent to the control section 48. At the control section 48, all the necessary signals are sequentially changed over by the signal selecting circuit 40 in accordance with the contents of the request signal, and the light emission elements 30a and 30b are extinguished. The A/D converter 41 converts the signals to digital form. The signals are then stored into the offset data storing section 47 (S203).

Subsequently, the control section 48 sends a signal to the light emission element lighting control circuit 49 as an instruction to light up only one of light emission elements 30a or 30b. Circuit 49 then controls the switching circuits 36 and 37, and current flows to the light emission element 30a or 30b from the power source 38 to light up the necessary light emission element 30a or 30b (S204). The word "necessary" means that this light emission element must be lit in order to satisfy the request data contained in the request signal. The light being radiated from the light emission element 30a or 30b is entered into the light receiving element 33a or 33b through the index scale 31 and the main scale 32. The light being radiated into the light receiving element 33a or 33b is converted into a current and input into the signal selecting circuit 40 through the differential amplifier circuit 34. A signal corresponding to a command from the control section 48 is selected by the signal selecting circuit 40, digitalized by the A/D converter 41 and input into the offset compensating circuit 42 (S205).

The control section 48 sends a command for extinguishing the light emission element 30a or 30b to the light emission element lighting control circuit 49 which extinguishes the light emission element 30a or 30b via the switching circuits 36 or 37 (S206). The offset data of the signal is input to the offset compensating circuit 42 from the offset data storing section 47 under the command of control section 48, and the offset compensating circuit 42 outputs to the data synthesizing circuit 43 the data which results from a subtraction of the data of offset data storing section 47 from the data of A/D converter 41 (S207).

The control section 48 then makes a judgement as to whether there exists any remaining necessary data (S208) in accordance with the decoded result of the request signal, and if there is any remaining necessary data, the process returns to Step S204, and repeats the actuation from S205 to Step S208. That is, necessary data would still remain if the request data contents contained an instruction to obtain both the higher ranking bit and lower ranking bit of an absolute value position, and the just-described operation where only one light emission element was illuminated obtained only the higher ranked bit. It is still necessary, in order to completely satisfy the request data, to light the other light emission element to obtain the lower ranked bit.

If any other necessary data exists at Step S208, the data synthesizing circuit 43 synthesizes the data of a signal obtained under the command of the control section 48, and sends the data to the data output circuit 44 (S209). The data output circuit 44 outputs this data as an absolute value signal to the outside source (servo amplifier, NC unit, etc.) (S210).

Figure 7:
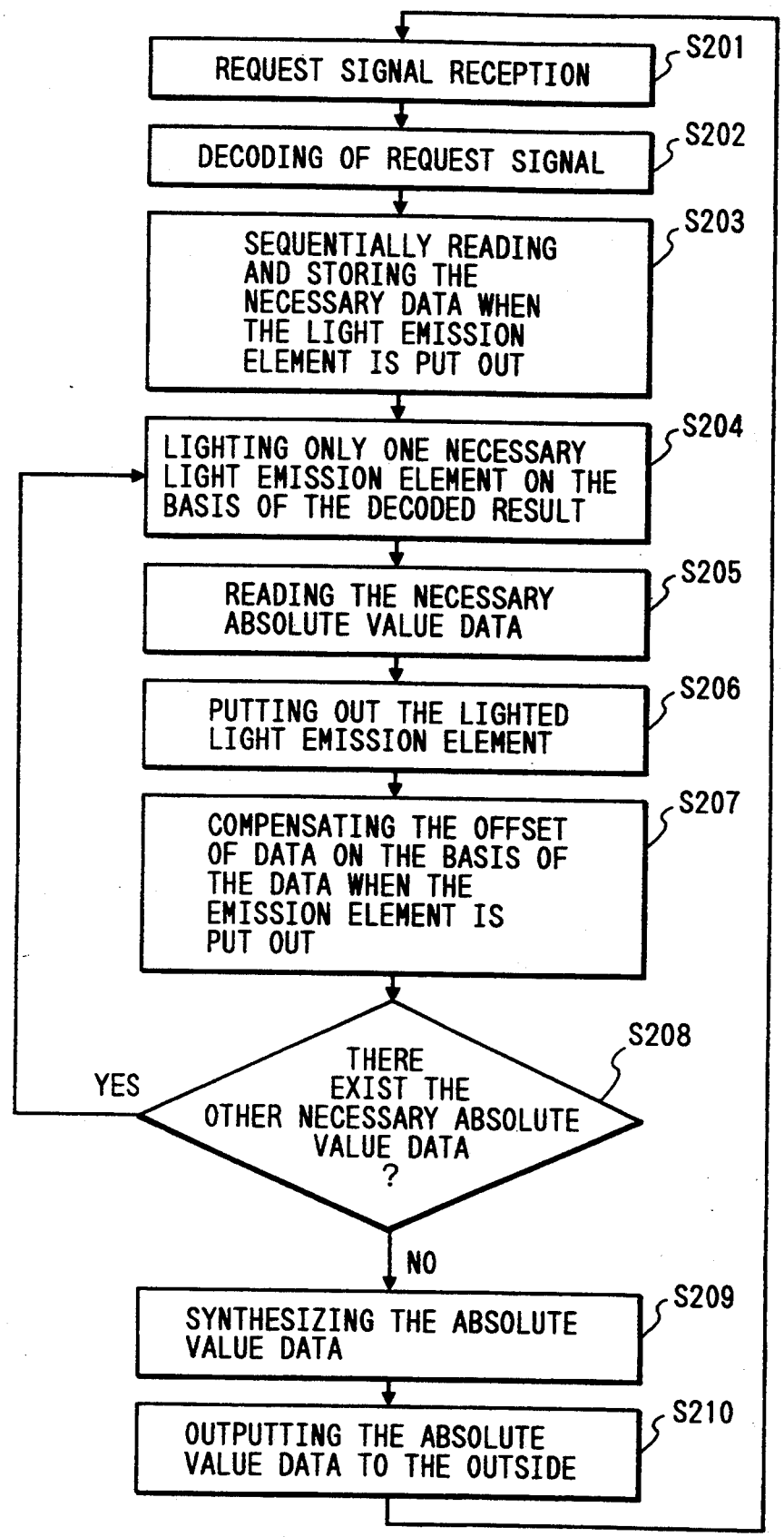
FIG. 7 is a flow diagram showing the control of a control circuit in a second embodiment of this invention.
Figure 8:
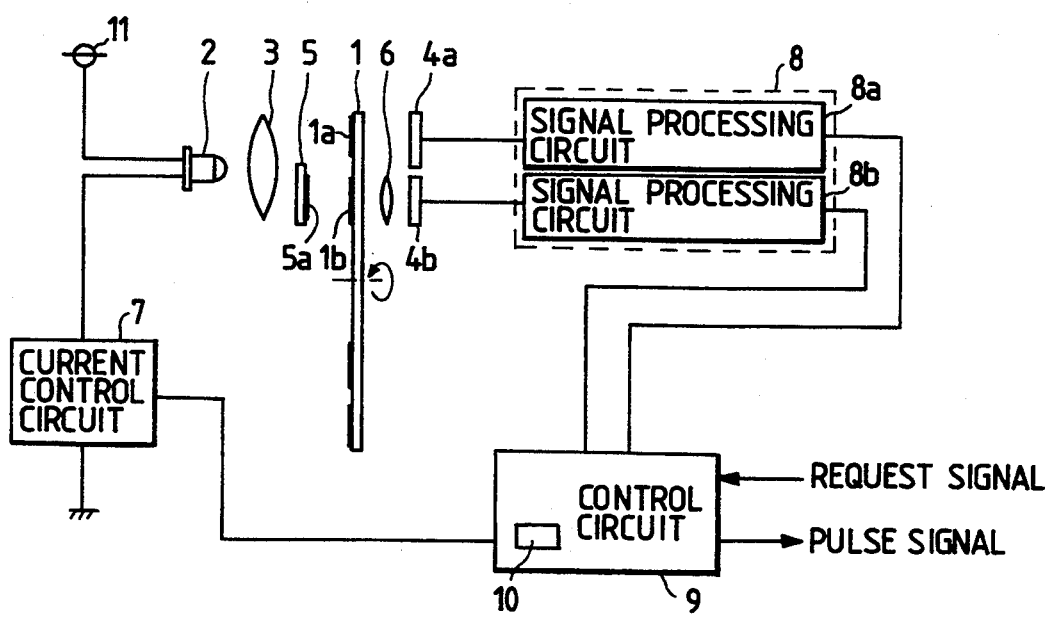
FIG. 8 is a block diagram showing a first comparative absolute value encoder.
Figure 9:
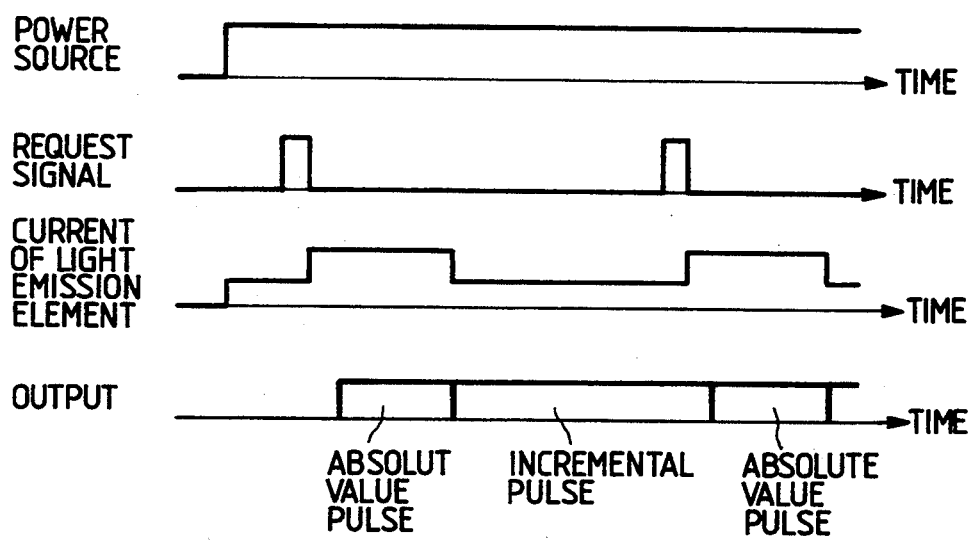
FIG. 9 is a diagram of the first absolute value encoder of FIG. 8.
Figure 10:
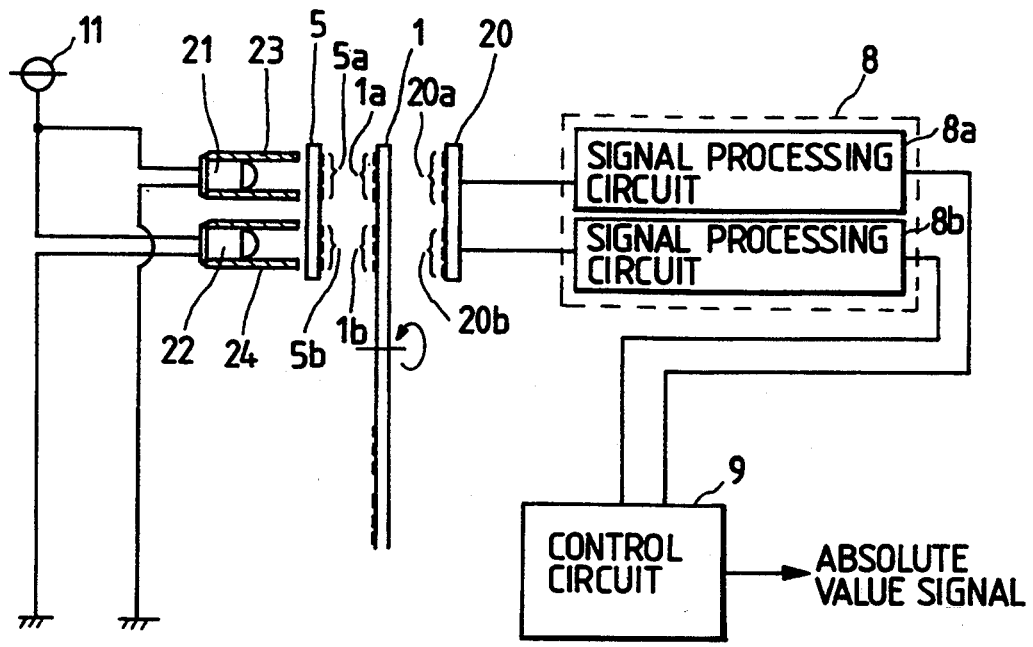
FIG. 10 is a block diagram showing a second comparison absolute value encoder.
Figure 11:
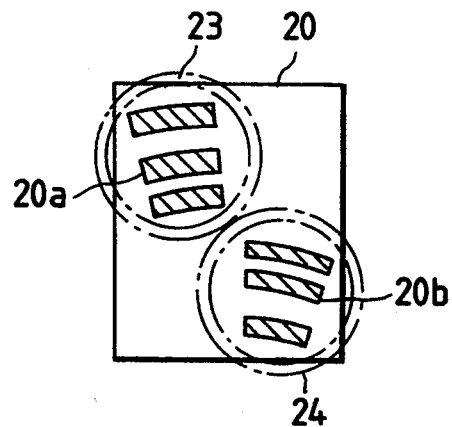
FIG. 11 is a view showing the light emission elements of the second encoder.

The second embodiment in FIG. 7 decodes the request signal from the outside source as described above for lighting and extinguishing a plurality of light emission elements independently from each other, while the control circuit reads the data with the light emission elements being extinguished, thereby enhancing the accuracy.

Further, since one of the light emission elements can be lighted after extinguishing another light emission element, this embodiment can prevent the light from another light emission element from influencing the light receiving element intended to receive light from one of the light emission elements.

Next, the third embodiment according to the present invention will be explained. Its structure is similar to that of the first embodiment, but in this embodiment, an input current averaging circuit, for example, a capacitor 39 is installed in the power source 38 for a light emitter 30 as shown by a dotted line in FIG. 1. An electric charge is accumulated on this capacitor 39 when the light emission elements 30a and 30b are not lighted. When the light emission elements 30a and 30b are lighted, on the other hand, the electric charge of the capacitor is discharged and flows to the light emission elements 30a and 30b.

As described above, the first and second embodiments of this invention detect and store an offset amount for subsequent use in determining an accurate A/D and encoder output.

As described above, the second and third embodiments of this invention light up and extinguish a plurality of light emission elements independently from each other by decoding the external request signal commanding light emission elements to light up. As a result, the power saving of the absolute value encoder and the realization of longer service life of the light emission elements can not only be attained but there also is the effect of enhancing the detection accuracy by the encoder because the data can be read with unneeded light emission elements being extinguished.

Because the second and third embodiments of this invention eliminate the function of lighting two light emission elements at the same time, the influence of a second light emission element can be removed, thus further enhancing the effects available in the first embodiment.

Because the third embodiment is designed to illuminate the second light emission element only after extinguishing the first light emission element, the influence of one light emission element on the other light emission element is eliminated and the detection accuracy is enhanced in addition to the effects available in the first and second embodiments.

Because the fourth embodiment of this invention has an input current averaging circuit for averaging the input current, the power source capacity at the outside source can be made smaller in addition to the effects available in the remaining embodiments.

The entire disclosure of each and every foreign patent application from which the benefit of foreign priority has been claimed in the present application is incorporated herein by reference, as if fully set forth.

Although this invention has been described in at least one preferred embodiment with a certain degree of particularity, it is to be understood that the present disclosure of the preferred embodiment has been made only by way of example and that numerous changes in the details and arrangement of components may be made without departing from the spirit and scope of the invention,

What is claimed is:

1. An absolute value encoder comprising:
    a plurality of light emission elements;
    a light receiving circuit having a plurality of light receiving elements corresponding to said plurality of light emission elements;
    a lighting means for lighting said light emission elements;
    a signal decoding means for decoding an external request signal;
    a drive signal preparing means for preparing a drive signal of said lighting means in accordance with a decoded result of said signal decoding means and also in accordance with a signal from a signal processing/control circuit;
    wherein said signal processing/control circuit includes means for computing absolute value data from an output of said light receiving circuit with said plurality of light emission elements being extinguished and from an output of said light receiving circuit with at least one of said plurality of light emission elements being lighted up.

2. An absolute value encoder as described in claim 1, further comprising:
an input current averaging means installed in a power source of said plurality of light emission elements.

3. An absolute valve encoder as described in claim 1, wherein said means for computing further comprises means for obtaining the difference between said output of said light receiving circuit with said plurality of light emission elements being extinguished and said output of said light receiving circuit with said plurality of light emission elements being lighted up.

4. An output compensation method of an absolute value encoder comprising:
lighting at least one of a plurality of light emission elements;
preparing a lighting signal for decoding an external request signal, decoding said external signal and lighting said light emission elements in accordance with the decoded result;
reading and storing an output from a light receiving circuit in a state where the light emission elements are extinguished;
lighting said light emission elements and reading the output from the light receiving circuit; and
computing absolute value data from the data stored when said light emission elements are extinguished and the data read when said light emission elements are lighted.

5. The method of claim 4, further comprising:
lighting up said light emission elements one at a time to read the output of only one corresponding light receiving element corresponding to a presently lighted-up light emission element;
extinguishing said light emission element;
correcting the data and making a judgement of whether there are any more light emission elements which need to be sequentially lighted, based on the decoded request signal; and
lighting up another light emission element if there are more light emission elements which need to be sequentially lighted to compute absolute value data.

6. An output compensation method of an absolute value encoder comprising:
lighting at least one of a plurality of light emission elements;
preparing a lighting signal for decoding an external request signal;
decoding said external signal and lighting only one of said light emission elements at a time in accordance with the decoded result;
reading the output from the light receiving circuit corresponding to said any one of said lighted elements; and
thereafter extinguishing the lighted light emission element before lighting another light emission element.

7. The method of claim 6, further comprising:
computing offset data when said lighting elements are extinguished; and
computing absolute value data from the data stored when said light emission elements are extinguished and the data read when said light emission elements are lighted.

* * * * *